(12) United States Patent
Andersen et al.

(10) Patent No.: US 11,199,177 B2
(45) Date of Patent: Dec. 14, 2021

(54) DETECTING ELECTRICAL FAILURES IN A WIND TURBINE GENERATOR CONTROL SYSTEM

(71) Applicant: VESTAS WIND SYSTEMS A/S, Aarhus N (DK)

(72) Inventors: Lars Rohrmann Andersen, Hadsten (DK); John Bengtson, Århus C (DK); Karl Axel Pétursson, Hadsten (DK)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 132 days.

(21) Appl. No.: 16/472,948

(22) PCT Filed: Dec. 12, 2017

(86) PCT No.: PCT/DK2017/050421
§ 371 (c)(1),
(2) Date: Jun. 24, 2019

(87) PCT Pub. No.: WO2018/113873
PCT Pub. Date: Jun. 28, 2018

(65) Prior Publication Data
US 2019/0368469 A1    Dec. 5, 2019

(30) Foreign Application Priority Data

Dec. 22, 2016   (DK) .............................. PA201671033

(51) Int. Cl.
*F03D 17/00* (2016.01)
*G01R 31/28* (2006.01)
(Continued)

(52) U.S. Cl.
CPC ......... *F03D 17/00* (2016.05); *G01R 31/2829* (2013.01); *G05B 19/0428* (2013.01);
(Continued)

(58) Field of Classification Search
CPC ......... F03D 17/00; F03D 7/042; G01R 31/50; G01R 31/2829; G01R 31/54;
(Continued)

(56) References Cited

U.S. PATENT DOCUMENTS 6,382,740 B1 * 5/2002 Peichl ...................... B60T 8/36
303/122.08
2003/0085729 A1   5/2003 Binkley et al.
(Continued)

FOREIGN PATENT DOCUMENTS

CN          1786726 A    6/2006
CN        101153809 A    4/2008
(Continued)

OTHER PUBLICATIONS

Chinese Office Action for Application No. 201780078599.2 dated Apr. 27, 2020.
(Continued)

*Primary Examiner* — Tung X Nguyen
*Assistant Examiner* — Feba Pothen
(74) *Attorney, Agent, or Firm* — Patterson + Sheridan, LLP

(57) ABSTRACT

A method of detecting electrical failures in a wind turbine generator control system is described. The method comprises sending a test pulse through a signal path within the control system and detecting the test pulse once it has passed through the signal path, measuring a current through the signal path, and determining an input status and/or an output status of the signal path. Then, the nature of the electrical failure is identified based on a combination of the detected test pulse, the measured current and the determined input status and/or output status of the signal path.

10 Claims, 4 Drawing Sheets

(51) Int. Cl.
  *G05B 19/042* (2006.01)
  *G01R 31/50* (2020.01)
  *G01R 31/54* (2020.01)

(52) U.S. Cl.
  CPC .......... *F05B 2260/83* (2013.01); *G01R 31/50* (2020.01); *G01R 31/54* (2020.01); *G05B 2219/2619* (2013.01); *G05B 2219/2639* (2013.01)

(58) Field of Classification Search
  CPC ...... G01R 31/343; G01R 31/67; G01R 31/55; G01R 31/52; G01R 31/58; G01R 31/28; G05B 19/0428; G05B 2219/2619; G05B 2219/2639; G05B 23/0256; F05B 2260/83; Y02E 10/72
  See application file for complete search history.

(56) References Cited

U.S. PATENT DOCUMENTS

| | | | |
|---|---|---|---|
| 2008/0277938 A1* | 11/2008 | Oohara | F03D 7/0224 290/44 |
| 2009/0066166 A1 | 3/2009 | Llorente Gonzalez et al. | |
| 2009/0259429 A1 | 10/2009 | Elisiussen | |
| 2011/0133458 A1 | 6/2011 | Harrison et al. | |
| 2015/0068278 A1* | 3/2015 | Yazawa | F02P 19/027 73/23.32 |
| 2015/0116131 A1* | 4/2015 | Ikeda | F03D 17/00 340/870.07 |
| 2015/0316621 A1 | 11/2015 | Ieda et al. | |
| 2017/0272024 A1* | 9/2017 | Mastrocola | B60T 17/221 |
| 2017/0292982 A1* | 10/2017 | Acena | G01R 31/006 |
| 2018/0026624 A1* | 1/2018 | Baik | H03K 17/687 361/42 |

FOREIGN PATENT DOCUMENTS

| | | |
|---|---|---|
| CN | 101441475 A | 5/2009 |
| CN | 102395892 A | 3/2012 |
| CN | 102608482 A | 7/2012 |
| CN | 103176101 A | 6/2013 |
| CN | 103380294 A | 10/2013 |
| CN | 103986889 A | 8/2014 |
| CN | 204228888 U | 3/2015 |
| CN | 105408945 A | 3/2016 |
| CN | 105486967 A | 4/2016 |
| CN | 206470357 U | 9/2017 |
| CN | 107250820 A | 10/2017 |
| EP | 0631149 A1 | 12/1994 |
| EP | 1514125 A2 | 3/2005 |
| EP | 1876460 A1 | 1/2008 |
| WO | 20040111665 A1 | 12/2004 |
| WO | 2018113873 A1 | 6/2018 |

OTHER PUBLICATIONS

Danish Patent Office First Technical Examination for Application No. PA 2016 71033 dated Jul. 3, 2017.
Patent Cooperatoin Treaty International Search Report PCT/DK2017/050421 dated Aug. 2, 2018.
PCT Written Opinion of the International Searching Authority for Application No. PCT/DK2017/0504221 dated Jul. 3, 2017.
Chinese Office Action for Application 201780078599.2 dated Dec. 10, 2020.

* cited by examiner

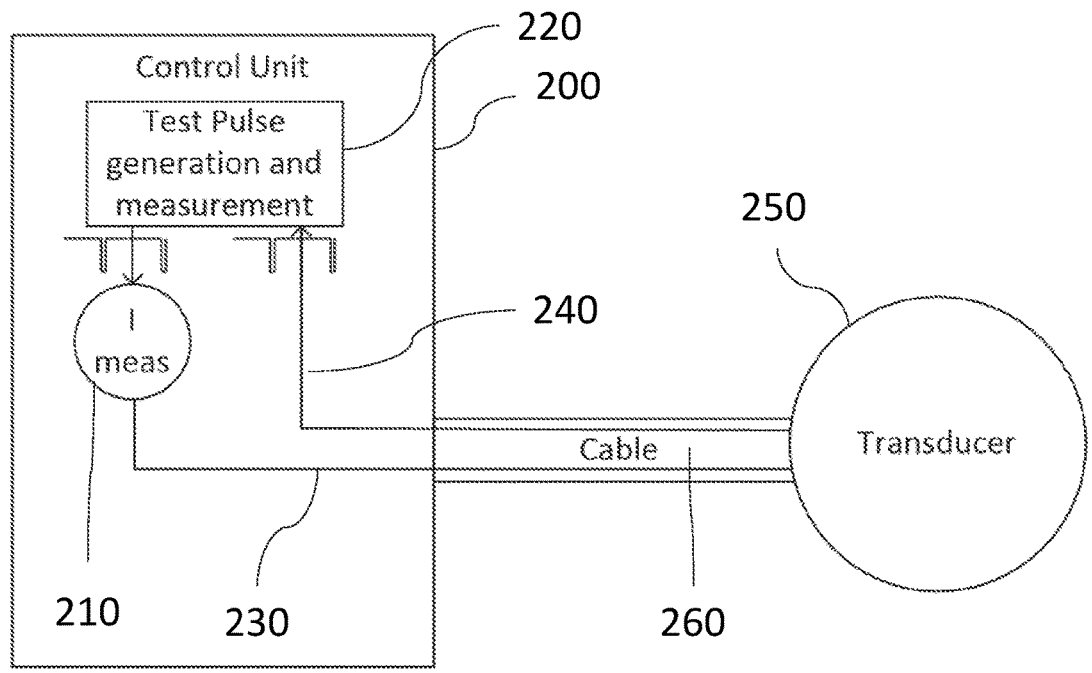

FIG 2

| Sensor System Failure Mode | Digital Output Line (O1) | Digital Input Line (I1) | Sensor not activated (contact closed) | | | | | | Sensor activated (contact open) | | | | | |
|---|---|---|---|---|---|---|---|---|---|---|---|---|---|---|
| | | | O1 | | | | I1 | | O1 | | | | I1 | |
| | | | Output Set Value | Stuck at High | Stuck at Low | Overcurrent | Input Status | Stuck at High | Output Set Value | Stuck at High | Stuck at Low | Overcurrent | Input Status | Stuck at High |
| 1 | OK | OK | 1 | 0 | 0 | 0 | 1 | 0 | 1 | 0 | 0 | 0 | 0 | 0 |
| 2 | Open | OK | 1 | 0 | 0 | 0 | 0 | 0 | 1 | 0 | 0 | 0 | 0 | 0 |
| 3 | Short24 | OK | 1 | 1 | 0 | 0 | 1 | 1 | 1 | 1 | 0 | 0 | 0 | 0 |
| 4 | ShortGD | OK | 1 | 0 | 1 | 1 | 0 | 0 | 1 | 0 | 1 | 1 | 0 | 0 |
| 5 | ShortI1 | OK | 1 | 0 | 0 | 0 | 1 | 0 | 1 | 0 | 0 | 0 | 1 | 0 |
| 6 | OK | Open | 1 | 0 | 0 | 0 | 0 | 0 | 1 | 0 | 0 | 0 | 0 | 0 |
| 7 | OK | Short24 | 1 | 1 | 0 | 0 | 1 | 1 | 1 | 0 | 0 | 0 | 0 | 1 |
| 8 | OK | ShortGD | 1 | 0 | 1 | 1 | 0 | 0 | 1 | 0 | 0 | 0 | 0 | 0 |

FIG 4

DETECTING ELECTRICAL FAILURES IN A WIND TURBINE GENERATOR CONTROL SYSTEM

FIELD OF THE INVENTION

The present invention relates to a method and apparatus for detecting electrical failures in a wind turbine generator control system.

BACKGROUND TO THE INVENTION

A typical wind turbines comprise a fixed tower which stands on the ground or sea bed, and a nacelle which rests on the top of the tower and carries a turbine shaft, a gearbox, a brake, a generator, a blade pitch controller which controls the angle of the turbine blades, and yaw drives which control the position of the wind turbine relative to the wind. Turbine blades are mounted to the turbine shaft externally of the nacelle. The turbine blades cause the shaft to rotate under the influence of wind, which in turn drives the generator to generate electrical power.

The overall operation of a wind turbine is controlled by a control system. The control system comprises sensors for determining the current status of the turbine equipment and operation, and the local environment, a processor for handling the outputs of those sensors, and actuators for controlling turbine operation. It will be appreciated that the sensors and actuators (transducers) may fail completely, become faulty, or generally degrade over time. Being able to accurately identify the nature of a fault, such as whether the fault relates to a sensor, to a control unit, or to a cable connecting the sensor and control unit together, is challenging.

It is against this background that the invention has been devised.

SUMMARY OF THE INVENTION

In a first aspect, the invention provides a method of detecting electrical failures in a wind turbine generator control system, the method comprising:
  sending a test pulse through a signal path within the control system and detecting the test pulse once it has passed through the signal path;
  measuring a current through the signal path;
  determining an input status and/or an output status of the signal path; and
  identifying the nature of the electrical failure based on a combination of the detected test pulse, the measured current and the determined input status and/or output status of the signal path.

The combination of the detected test pulse, the measured current and the input and/or output status of the signal path may be used to identify where in the signal path an electrical failure has occurred.

The current is preferably measured while the test pulse is not being sent through the signal path. Measuring the current may comprise making a first current measurement when an output of the signal path is high, and making a second current measurement when an output of the signal path is low.

The signal path may comprise a control unit, a transducer and a cable between the control unit and the transducer, and the detected test pulse and measured current are used in combination to determine in which of the control unit, transducer and cable the electrical failure has occurred. The transducer may be a sensor or an actuator.

The signal path may comprise a digital input line between the control unit and the sensor and a digital output line between the control unit and the sensor, the test pulse being detected on the digital input line and the current being measured at the digital output line. In some cases, the test pulse is also detected on the digital output line. The test pulses may be asserted on the digital output line.

A failure mode may be identified based on an output set value for the digital output line, a stuck at high condition of the digital output line, a stuck at low condition for the digital output line, an overcurrent condition for the digital output line, an input status of the digital input line and a stuck at high condition for the digital input line.

The electrical fault may be identified as one of an open circuit condition on the digital input line or the digital output line, a short to ground on the digital output line or the digital input line, a short to high on the digital output line or the digital input line, or a short between the digital output line and the digital input line.

In a second aspect, the invention provides a diagnostic apparatus for detecting electrical failures in a wind turbine generator control system, the apparatus comprising:
  a pulse generator for sending a test pulse through a signal path within the control system and a pulse detector for detecting the test pulse once it has passed through the signal path;
  a current measurement device for measuring a current through the signal path;
  status determination circuitry for determining an input status and/or an output status of the signal path; and
  a failure detector for identifying the nature of the electrical failure based on a combination of the detected test pulse, the measured current and the determined input and/or output status.

Other aspects of the invention include a wind turbine control system comprising the diagnostic apparatus set out above, a wind turbine generator comprising such a wind turbine control system, and a computer program product carrying a computer program for performing the above method.

Generally, the present techniques apply equally to both sensors and actuators as forms of transducer. Accordingly, these terms are often used interchangeably herein.

BRIEF DESCRIPTION OF THE DRAWINGS

FIG. 2 is a schematic drawing of a control system for a wind turbine generator;

FIG. 4 is a diagnostic table indicating failure modes for the control circuit of FIGS. 3A and 3B as a function of various parameters derived from test pulse signals, current measurements and input and output states of the control circuit.

DETAILED DESCRIPTION OF EMBODIMENTS OF THE INVENTION

Figure 1:
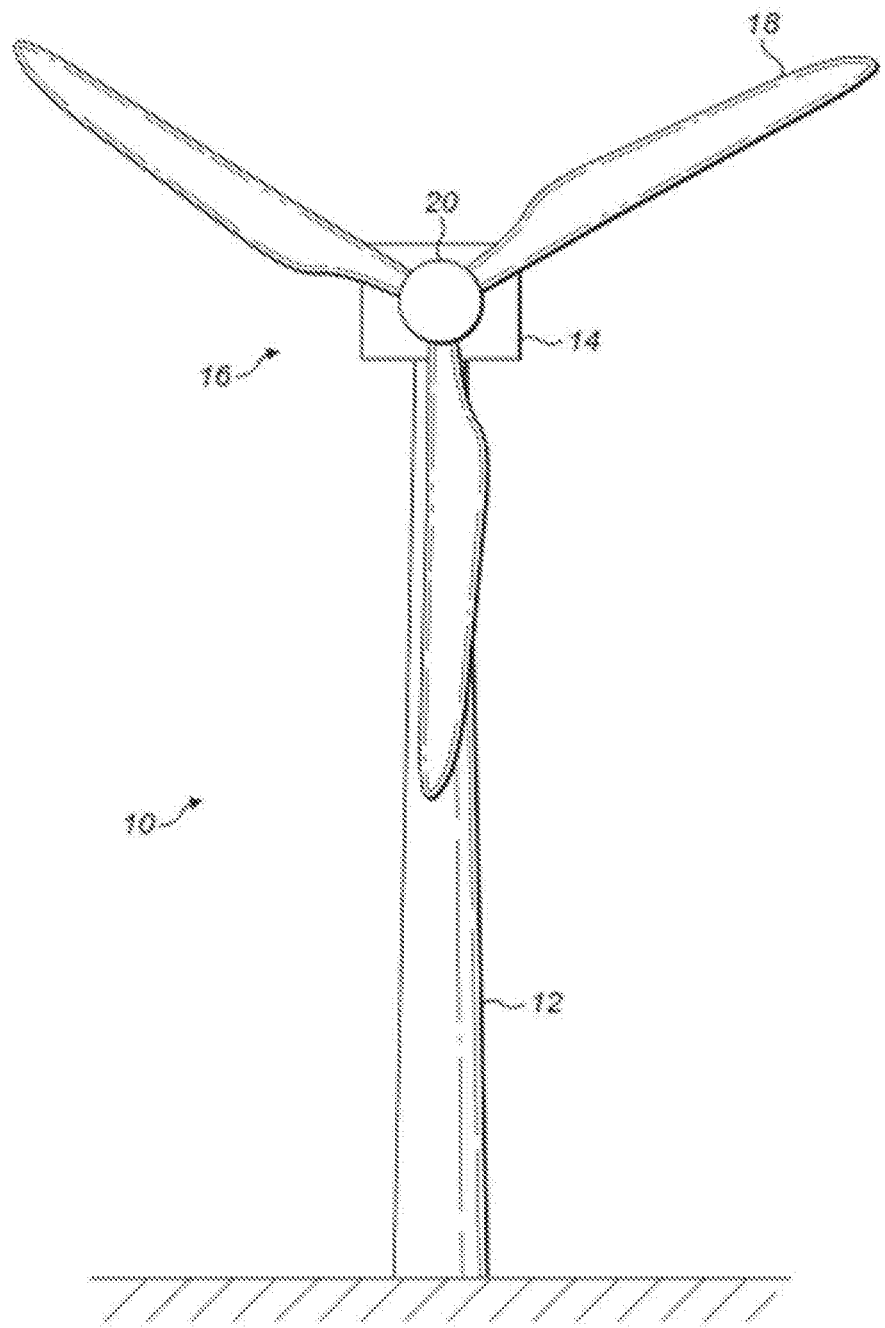
FIG. 1 is a schematic drawing of a wind turbine generator.

FIG. 1 shows a wind turbine 10 comprising a tower 12 supporting a nacelle 14 to which a rotor 16 is mounted. The rotor 16 comprises a plurality of wind turbine blades 18 that extend radially from a central hub 20. In this example, the rotor 16 comprises three blades 18. As discussed above, the pitch (angle of attack with respect to the wind) of the wind turbine blades 18 can be adjusted by a blade pitch controller (not shown), while the yaw of the nacelle 14 can be adjusted by a yaw drive (not shown) to face generally into the wind. The rotor 16 is mounted on a main bearing (not shown), which permits the rotor to rotate freely about its axis. The wind turbine blades 18 are each mounted to the rotor via blade bearings (not shown), which permit the blade 18 to rotate about their longitudinal axis to adjust their pitch. It will be understood that many such wind turbines can be established in a site, or wind farm, covering an area of several square kilometres.

The overall operation of the wind turbine 10 is controlled by a control system. Part of such a control system is shown in FIG. 2. In practice, it will be understood that a wind turbine generator control system will include many components, including a large number of transducers (sensors and actuators), processing circuitry and software. For the purposes of explaining the present technique, only those components directly concerned are shown in the Figures. Moreover, only a single transducer is shown, whereas in practice the present techniques would be applied in parallel to many sensors of the wind turbine generator control system. In FIG. 2, a control unit 200 comprises test pulse generation and measurement circuitry 220. Power is provided to a transducer 250 via a (digital) output line 230. The current passing through the output line 230 can be measured by a current measurement device 210. A data signal from the transducer is carried back to the control unit on a (digital) input line 240. The test pulse generation and measurement circuitry, the output line 230, the transducer 250 and the input line 240 form a signal path. Where the transducer 250 is a sensor, electrical power is carried to the sensor via the output line 230, and a return signal (representing the sending operation of the sensor) is carried back to the control unit 200 on the input line 240. Where the transducer 250 is an actuator, there may be no return signal carried back to the control unit, and the input line 240 will then simply close the loop of the electrical circuit. The output line 230 and the input line 240 reach the transducer via a cable 260. It will be appreciated that the control unit 200 may switch off the transducer 250 by setting the output line 230 to a low power state (no power or low power), and switch on the transducer 250 by setting the output line 230 to a high power state. The control unit 200 also comprises output feedback circuitry which measures the output line 230 to determine if it has a high value or a low value, and input value detection circuitry which measures the input line 240 to determine if it has a high value or a low value.

When in a high power state, the current measurement device 210 is able to measure the current flowing through the output line 230 to indicates the current consumption of the transducer 250 connected to the output line 230. The purpose of this "high" current measurement is to detect overcurrent scenarios, for example external short-circuits or defects in the transducer 250 which cause excessive current consumption. The current measurement on the digital output line takes place periodically when the output is high.

In addition to the output high-state current measurement, the digital output has an output low-state current measurement. This measurement indicates if a small test-current is delivered to the transducer 250. The purpose of this current measurement is to detect a "broken wire" (open circuit) scenario. To achieve current measurement on passive low output, dedicated circuitry (not specifically shown in FIG. 2, but may be considered a part of the current measurement device 210) applies a test-current (a few µA) on the output line 230 and carries out an associated voltage measurement on the output line 230. If the output line 230 is not connected to the transducer 250 (open load scenario), the voltage on the output line 230 will rise to approximately 1.5V (in one example) and thus be detected as "open load" (broken wire).

It is possible to identify an output stuck-at-low scenario by detecting the output state by the output feed-back in combination with the current measurement. Stuck-at-low on an active high digital output will cause short-circuit current to run in the output (overcurrent scenario).

The test pulse generation and measurement circuitry 220 asserts a test-pulse on an active (high) digital output. A test-pulse is asserted by the output associated with the output line 240 and may be applied on the output by turning the output off for a duration of approximately 600 µs (for example). Shortly after switching the output off, and before the output is turned on again, the output status is verified to be low on both the output driver (through an output feedback signal measured on the output line) and on the input associated with the output through the sensor system (that is, by measuring the return signal on the input line 240). Associations between inputs and outputs may be stored in a configuration table. The detection or non-detection of asserted test pulses on the input line 240 makes it possible to identify short or open circuits. Where the test-pulse is also detected (or cannot be detected) at the digital output line through an output signal feed-back, detection of stuck-at-high states on actuator outputs becomes possible. Such outputs could for example control solenoid valves which do not provide any feed-back to a controller input (so that test pulses cannot be detected on the input line 240).

By combining the current and pulse measurement techniques utilising controller knowledge the output set value, output line feedback and input line measurement, a more precise diagnosis than previously possible can be established for a sensor or actuator in a wind turbine generator. The measurements can be carried out substantially concurrently to be able to establish a diagnosis of the status of the unit being measured. Further, the combination of measurement results will indicate where the error is in the signal path. In some cases, the information obtained through the present technique may assist a user in identifying whether a detected fault is in the control unit, the cable, or in the transducer. This technique combines both types of measurement on one signal/path. This may enable errors to be detected and diagnosed to a higher degree than previously possible.

It will be understood that the test-pulse can be used to detect output "stuck-at-high" scenarios, the output high-state current measurement can detect output "stuck-at-low" scenarios and the output low-state current measurement can assist with detecting "broken wire" (open load) scenarios by deactivating (set to low) the output. Such deactivation could be used in a diagnostic procedure with the purpose of identifying the root-cause of a malfunctioning sensor or actuator system. A suitable circuit for broken wire detection may comprise a voltage source of ~1V in series connection with a 10 kohm resistor. If the output is connected to a load (the actuator) with reference to GND, a current of 100 uA will flow in the resistor. If the output has an open wire, the voltage on the output will raise to ~1V corresponding to the test voltage applied for open load detection.

It will also be understood that in addition to measuring current and test pulses, the actual status (low/high) on outputs (measured through output feed-back) and the actual status (low/high) on inputs as means of detecting the nature of an electrical failure is used.

Figure 3A:
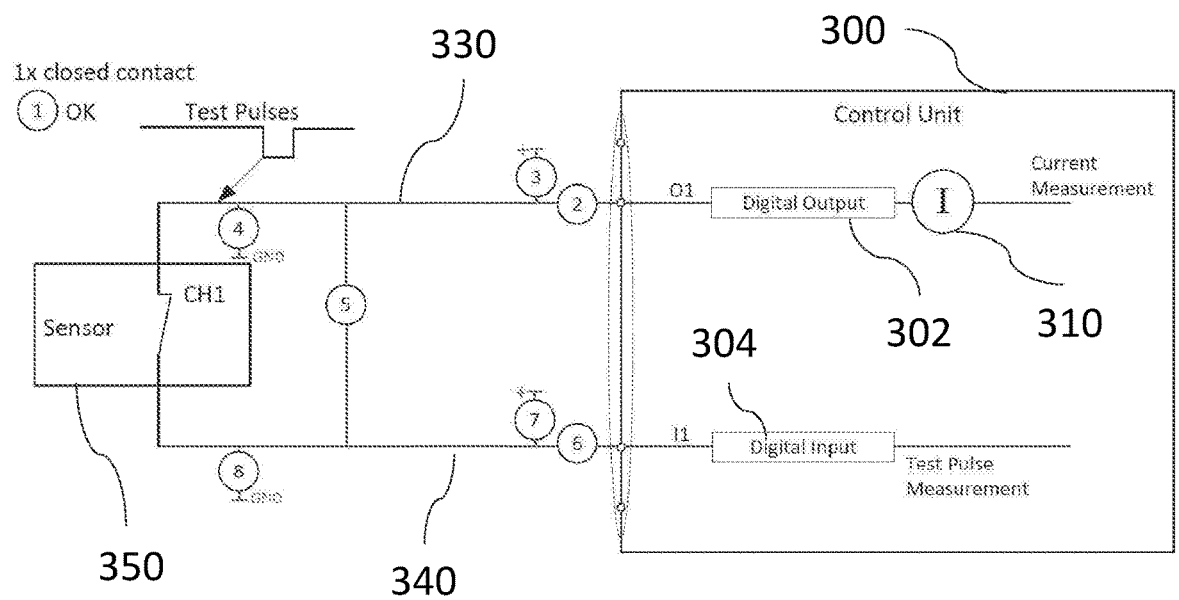
FIGS. 3A and 3B are schematic drawings of a control circuit for a sensor, in a sensor inactive (FIG. 3A) and active (FIG. 3B) state.
Figure 3B:
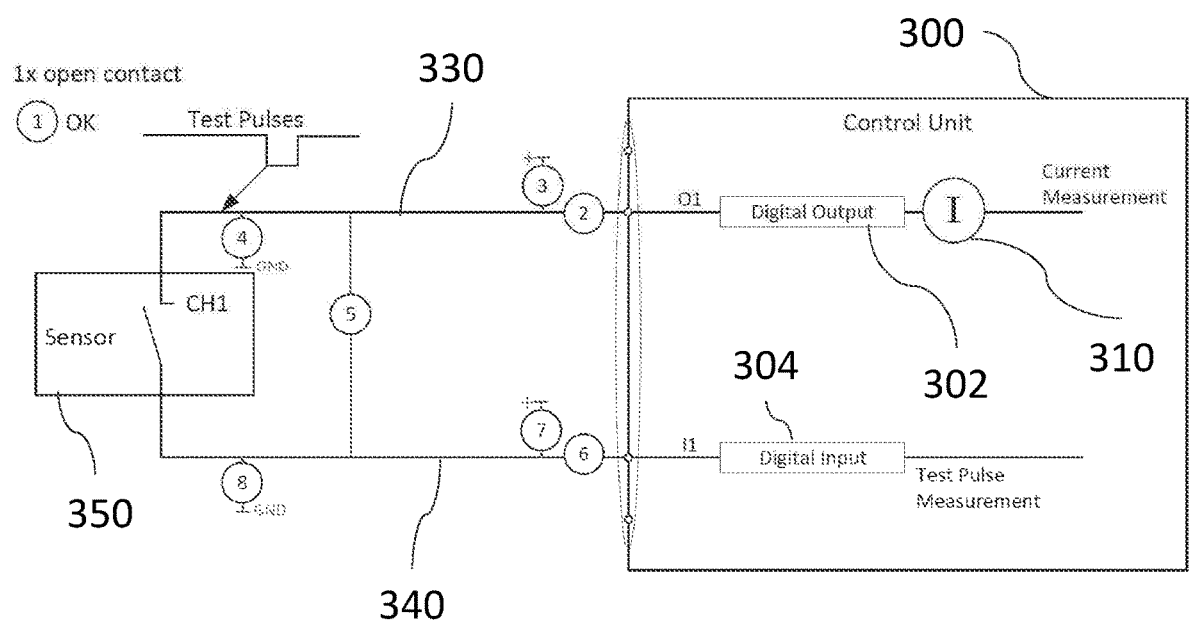

Referring to FIGS. 3A and 3B, a control circuit for a sensor is shown in a sensor inactive (FIG. 3A) and active (FIG. 3B) state. In both cases, a control unit 300 serves to power, control and measure the signal outputs of a sensor 350. In FIG. 3A, the sensor 350 is in a "closed contact" state in which the sensor is not active. In FIG. 3B, the sensor 350 is in an "open contact" state in which the sensor is active. The control unit 300 can be seen to comprise a digital output 302 which applies electrical power in the form of an electrical signal onto a digital output line (01) 330, a digital input 304 which receives a return signal on a digital input line (11) 340 and a current measurement device 310 which corresponds to the device 210 of FIG. 2. It will be appreciated that current measurement takes place on an active high output, with the device 310 being in-line with the output driver (digital output 302).

For simplicity, the test pulse generation and measurement circuitry 220 is not shown in FIGS. 3A and 3B, but it will be appreciated that the test pulse is asserted onto the output line 330 by the digital output 302, and is detected both by the digital input 304, and on the digital output line 340 (this could be at any location on the output line 340). The digital output line 330 carries power and/or control signals to the sensor 350. The digital output line 340 carries a data signal from the sensor 350 to the digital input 302. The numbers "2" to "8" in circles indicate failure modes, and in particular indicate where in the signal path those failures occur. The number "1" in a circle indicates an "OK" mode, where the circuit is operating normally. The failure modes are as follows:

Failure mode 1: All OK
Failure mode 2: Open circuit on the digital output line 330
Failure mode 3: Short to high (24V) on the digital output line 330
Failure mode 4: Short to ground on the digital output line 330
Failure mode 5: Short between the digital output line 330 and the digital input line 340
Failure mode 6: Open circuit on the digital input line 340
Failure mode 7: Short to high (24V) on the digital input line 340
Failure mode 8: Short to ground on the digital input line 340

FIG. 4 is a diagnostic table indicating the 8 failure modes for the control circuit of FIGS. 3A and 3B as a function of various parameters derived from test pulse signals, current measurements and input and output states of the control circuit. The table demonstrates how the measurements made by the current measurement device, the test pulse generation and measurement circuitry, and high/low status on the input and output lines can be used to diagnose the nature of faults on the signal path.

The following parameters (represented by columns in the table) are used:

Output Set Value: This is the high (1) or low (0) state which the output driver is applying to the output line 230, and which is known to the control unit 200. Generally, the output value to a sensor will always be "1" as the sensor needs power to function. If it were set to "0" there would be no reaction from the sensor since it is deactivated. Setting an output value to "0" will uncover a state where another signal is interfering with the output, and would therefore indicate an error. This is how the test pulse is used—by setting the output to "0" for a very short time, enabling the measurements of "stuck to high" etc. Since this occurs merely as a temporary change, a value of "0" for the output set value is not specified as part of a failure modes. In principle, a further failure state could be specified having an output set value "0", to indicate a sensor that is deactivated.

Output Stuck-at-High: This indicates whether the output line is stuck at a high state when the output to the line is set to a low state. A high (1) value indicates that the output line is stuck at high, while a low (0) value indicates the output line is not stuck at high (that is, it is able to go low when the output onto the output line is set low). This parameter is set to a high (1) value in response to a test pulse applied to the output line not being detected in the output signal feedback.

Output Stuck-at-Low: This indicates whether the output line is stuck at a low state when the output to the line is set to a high state. A high (1) value indicates that the outline line is stuck at low, while a low (0) value indicates the output line is not stuck at low (that is, it is able to go high when the output onto the output line is set high). This parameter is set to a high (1) value in response to the output set value being low when the output feedback measurement indicates a high value on the output line 230.

Overcurrent: This indicates whether an unexpectedly high current is flowing through the current measurement circuitry when the output line is set to high. This parameter is set to a high (1) value in response to a current level measured by the current measurement circuitry 210 exceeding a predetermined threshold value.

Input Status: This indicates whether the digital input is at a high state, as determined by the input value detection circuitry.

Input Stuck-at-High: This indicates whether the input line is stuck at a high state when the output line is set to a low state. A high (1) value indicates that the input line is stuck at high, while a low (0) value indicates the input line is not stuck at high (that is, it is able to go low when the output onto the output line is set low). This parameter is set to a high (1) value in response to a test pulse applied to the output line not being detected at the digital input.

In FIG. 4, the table shows diagnosis for 8 failure modes, both for the situation in which the sensor is not activated, and for the situation in which the sensor is activated. It will be recognised that the table is populated with different values for each of these two situations. It will be further recognised that in some cases a particular fault, or a location of a fault, can only be recognised in one of these situations (for example when the sensor is activated).

Taking each of the failure modes in turn:

Failure mode 1: This is indicative of normal operation of the signal path from the digital output 302 to the digital input 304. Taking first the "sensor not activated" case, the output set value is at "1", indicating that a high state signal is being asserted on the output line 330, and an input status of the digital input 302 is at "1", indicating that the signal applied by the digital output 302 has reached the digital input 304 via the signal path, as would be expected. All other parameters are set to zero. For the "sensor activated" case, the output set value is at "1", indicating that a high state signal is being asserted on the output line 330, but the input status of the digital input 302 is at "0", indicating that the signal applied by the digital output 302 has not reached the digital input 304 via the signal path, as would be expected due to the sensor contact being open in this case.

Failure mode 2: This is indicative of an open circuit condition on the digital output line 330. Taking first the "sensor not activated" case, the output set value is at "1", as per mode 1, but the input status of the digital input 302 is at "0", indicating that the signal applied by the digital output 302 has not reached the digital input 304 via the signal path. This means that there is a break in the signal path, that is, an "open" condition. All other parameters are set to zero. It will be noted that this failure mode is indistinguishable from failure mode 6 (that is, the parameters are the same in the table), since it is not possible to tell where on the signal path the open circuit condition has arisen with the sensor contact closed. For the "sensor activated" case, the parameters are exactly the same, but notably are also the same as for failure mode 1 in the "sensor activated" case, and also for the failure modes 6 and 8 in the "sensor activated" case. In other words, with the sensor activated it is not possible to identify an open circuit condition, and so it would be necessary deactivate the sensor to identify these failure modes.

Failure mode 3: This is indicative of a short to high (24V rail) on the digital output line 330. Taking first the "sensor not activated" case, the output set value is at "1", and the input status of the digital input 302 is at "1" as per mode 1, but the output line and the input lines are both stuck at high. It will be noted that this failure mode is indistinguishable from failure mode 7 (that is, the parameters are the same in the table), since it is not possible to tell where on the signal path the short has occurred. For the "sensor activated" case, the output side parameters are the same as for the "sensor not activated" case, but the input side parameters are set to "0". It will be noted that in the "sensor activated" case, it is possible to uniquely distinguish the failure mode 3 from the other failure modes (including from failure mode 7), and so identifying the failure mode 3 requires testing while the sensor is activated.

Failure mode 4: This is indicative of a short to ground (low) on the digital output line 330. Taking first the "sensor not activated" case, the output set value is at "1", and the input status of the digital input 302 is at "1" as per mode 1, but there is both a detected overcurrent on the output line and the output line is stuck at low. Moreover, the input status is set to "0", when it would be expected to be set at "1". It will be noted that this failure mode is indistinguishable from failure mode 8 (that is, the parameters are the same in the table), since it is not possible to tell where on the signal path the short has occurred. For the "sensor activated" case, the same parameters apply as for the "sensor not activated" case, but in the "sensor activated" case, it is possible to uniquely distinguish the failure mode 4 from the other failure modes (including from failure mode 8), and so identifying the failure mode 4 requires testing while the sensor is activated.

Failure mode 5: This is indicative of a short between the digital output line 330 and the digital input line 340. Taking first the "sensor not activated" case, the parameters are identical to those for failure mode 1 (normal operation), and so it is not possible to distinguish between normal operation and the failure mode 5 while the sensor is not activated. For the "sensor activated" case, it is possible to uniquely distinguish the failure mode 5 from operational mode 1, since the input status is set to "1" when it would be expected to be "0" due to the sensor contact being open. Accordingly, identifying the failure mode 5 requires testing while the sensor is activated.

Failure mode 6: This is indicative of an open circuit on the digital input line 340. Taking first the "sensor not activated" case, the output set value is at "1", as per mode 1, but the input status of the digital input 302 is at "0", indicating that the signal applied by the digital output 302 has not reached the digital input 304 via the signal path. This means that there is a break in the signal path, that is, an "open" condition. All other parameters are set to zero. It will be noted that this failure mode is indistinguishable from failure mode 2. For the "sensor activated" case, the parameters are exactly the same, but notably are also the same as for failure mode 1 in the "sensor activated" case, and also for the failure mode 6 in the "sensor activated" case.

Failure mode 7: This is indicative of a short to high (24V rail) on the digital input line 340. Taking first the "sensor not activated" case, the output set value is at "1", and the input status of the digital input 302 is at "1" as per mode 1, but the output line and the input lines are both stuck at high. It will be noted that this failure mode is indistinguishable from failure mode 3 (that is, the parameters are the same in the table), since it is not possible to tell where on the signal path the short has occurred. For the "sensor activated" case, the output side is not stuck at high (because the sensor contact being open isolates the output line from the input line and thus from the short to high), but the input side is stuck at high. It will therefore be appreciated that in the "sensor activated" case, it is possible to uniquely distinguish the failure mode 7 from the other failure modes (including from failure mode 3), and so identifying the failure mode 7 requires testing while the sensor is activated. In order to achieve this, a service engineer could be requested (by the system) to manipulate the transducer (sensor) between an active and inactive step, to discern between the failure modes 3 and 7 for example.

Failure mode 8: This is indicative of a short to ground on the digital input line 340. Taking first the "sensor not activated" case, the output set value is at "1", and the input status of the digital input 302 is at "1" as per mode 1, but there is both a detected overcurrent on the output line and the output line is stuck at low. Moreover, the input status is set to "0", when it would be expected to be set at "1". It will be noted that this failure mode is indistinguishable from failure mode 4 (that is, the parameters are the same in the table), since it is not possible to tell where on the signal path the short has occurred. For the "sensor activated" case, the parameters are the same as for failure modes 1, 6 and 8 in the "sensor activated" case, so with the sensor activated it is not possible to identify short to ground condition on the input line, and so it would be necessary deactivate the sensor to identify this failure mode.

It will be appreciated that the parameters can be obtained both for the sensor active and sensor inactive states, and unique identification of failure modes can be made by looking at both sets of parameters.

Figure 5:
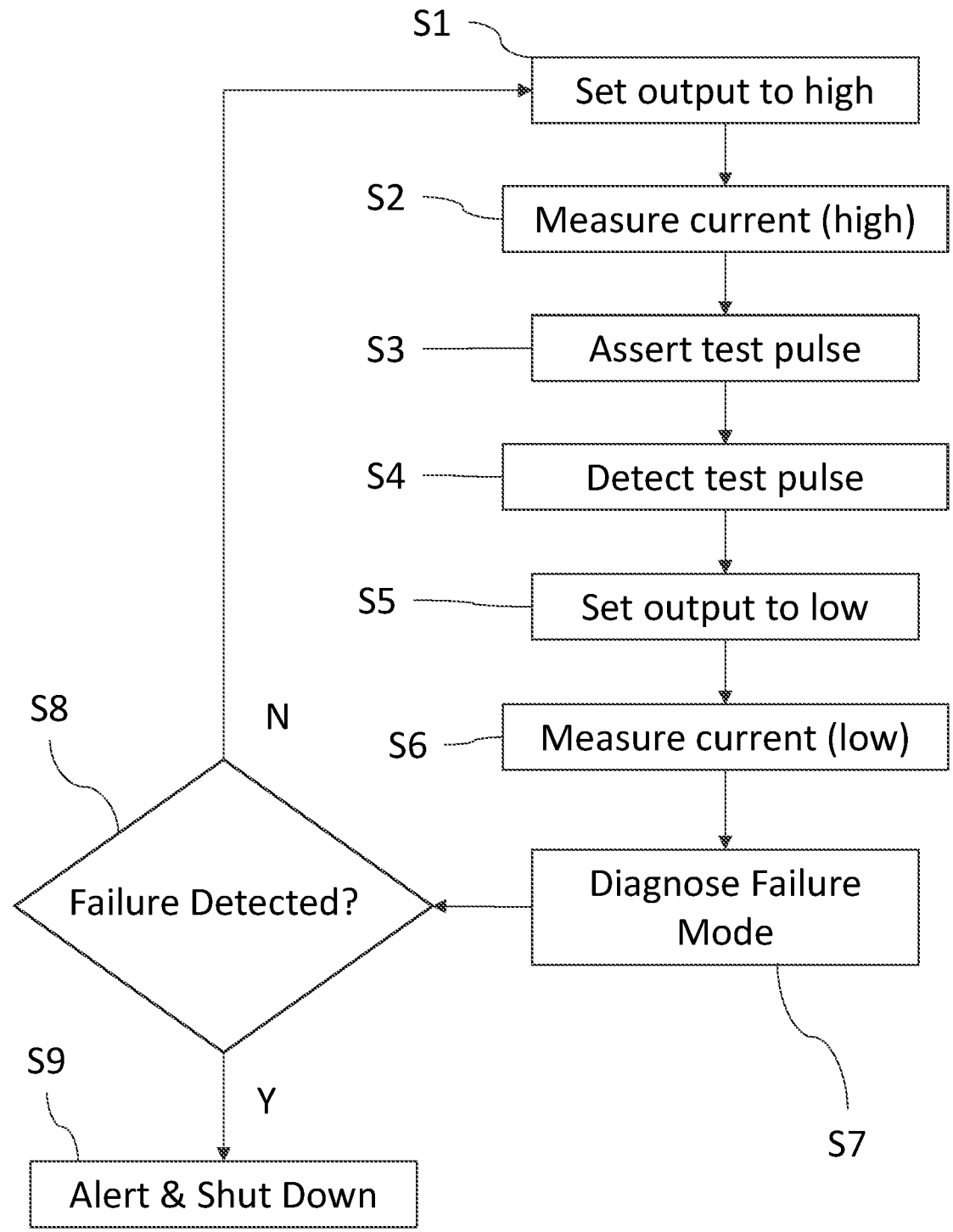
FIG. 5 is a schematic flow diagram of a test and diagnostic method.

Referring to FIG. 5, a flow diagram is provided explaining the measurement and diagnostic operation at a high level according to an example testing scheme. At a step S1, an output to the digital output line is set high. Then, a current measurement is made at a step S2. This forms the "high current" measurement described above. At a step S3, a test pulse is asserted on the output line, for example by switching off the digital output for a short period of time. At a step S4, the test pulse is detected on both the output line and the input line. At a step S5, the output is set to low, and then at a step S6 the current is measured again. This forms the "low current" measurement described above. At a step S7, the measured currents (high and low), the test pulse measurements (input and output), a status value measured on the digital input, a feedback value on the digital output and a output set value of the digital output are then used to diagnose the fault, for example by interrogating a look up table (such as that of FIG. 4) utilising the above parameters to identify a failure mode. At a step S8, if a failure is detected then at a step S9 an alert is generated and the sensor (and potentially the wind turbine) is shut down. If at the step S8 it is determined that there is no failure condition, then the process returns to the step S1, where the measurements are retaken (on a periodic basis). In practice, the output will not normally be set to low during wind turbine generator operation, but the other functions, relating to "output set value", "output status (feed-back)", "current measurement", "test-pulse", and "input status" may be used continuously during normal wind turbine generator operation.

The present technique may assist a user (for example a service engineer) in diagnosing whether a fault has arisen in relation to the controller, a transducer or a cable connecting the two. For example, the amount of current may indicate an excessive consumption but not a short circuit—which may suggest a fault external to the control unit as a short circuit on the control unit may have a lower impedance translating into a higher current. It will be appreciated in this case that there may need to be some guided user interaction involved, such that the control system will communicate which steps to follow for a service technician. For example, the technician may be instructed to unplug the cable from the control unit, in which case if the fault perseveres, the fault can be isolated to the control unit. In another example, unplugging the cable from the transducer may help determine if the cable is at fault or the transducer itself.

To exemplify the possible faults:
Transducer: This may be a malfunction internally in the sensor or actuator itself. For example, vibration may over time result in a short circuit, or no contact, inside the transducer.
Cable: This may be a malfunction relating to the cable or connectors. For example, if the service technician has inadvertently stepped on the cable repeatedly, creating a short circuit between the output and the input wires.
Control Unit: This may be a malfunction internally on the control unit. For example, during production a process fault may create a solder joint between a connector and a Printed Circuit Board with an excessive amount of solder that still goes through the test process undetected. After being in use for years in the turbine, the solder joint eventually creates a short circuit to the next pin on the connector.

The diagnostic signals described above determine if an interface has a fault of a certain type, such as "stuck-at-high", "open-load", "stuck-at-low", "high output current". This information can be provided to a service technician. This will help isolate the root cause of the fault. This information can be provided to the service technician before he visits the wind turbine generator and he may therefore be better prepared by bringing the right spare parts. By adding a service procedure for execution on-site it is possible, using dedicated diagnostic software functions, to narrow down or even pinpoint the root cause of the fault as a further help to the service technician. As the control system utilizes peer-to-peer shielded cables with little opportunity to perform measurements on the signals wires, the value of the diagnostic functions is simplified fault-finding and thus reduced service times.

While embodiments of the invention have been shown and described, it will be understood that such embodiments are described by way of example only and it will be appreciated that features of different embodiments may be combined with one another. Numerous variations, changes and substitutions will occur to those skilled in the art without departing from the scope of the present invention as defined by the appended claims. Accordingly, it is intended that the following claims cover all such variations or equivalents as fall within the spirit and the scope of the invention.

The invention claimed is:
1. A method of detecting electrical failures in a control system of a wind turbine generator, the method comprising:
measuring a current on a signal path within the control system while applying electrical power to the signal path, wherein the signal path comprises an output line, a transducer of the wind turbine generator, and an input line, wherein the output line is coupled to the transducer, wherein the transducer is coupled to the input line, and wherein applying the electrical power to the signal path activates the transducer;
asserting a test pulse on the output line while electrical power is applied to the signal path;
determining whether the test pulse is detected on the output line;
determining whether the test pulse is detected on the input line;
reducing the electrical power to the signal path such that the transducer is deactivated;
applying a test current to the signal path while the transducer is deactivated;
determining whether the test current reaches the transducer; and
identifying an electrical failure within the wind turbine generator based on a combination of the current, whether the test pulse is detected on the output line, whether the test pulse is detected on the input line, and whether the test current reached the transducer.

2. The method according to claim 1, wherein the combination is used to identify where in the signal path the electrical failure has occurred.

3. The method according to claim 1, wherein the current is measured while the test pulse is not being sent through the signal path.

4. The method according to claim 1, wherein the combination is used to determine in which of the transducer, the input line, and the output line the electrical failure has occurred.

5. The method according to claim 4, wherein the transducer is a sensor or an actuator.

6. The method according to claim 1, wherein the current is measured on the output line.

7. The method according to claim 6, wherein a failure mode is identified based on an output set value for the output line, a stuck at high condition of the output line, a stuck at low condition for the output line, an overcurrent condition for the output line, an input status of the input line, and a stuck at high condition for the input line.

8. The method according to claim 6, wherein the electrical failure can be identified as one of an open circuit condition on the input line or the output line, a short to ground on the output line or the input line, a short to high on the output line or the input line, or a short between the output line and the input line.

9. A diagnostic apparatus for detecting electrical failures in a control system of a wind turbine generator, the diagnostic apparatus comprising:
a current measurement device for measuring a current on a signal path within the control system while electrical power is applied to the signal path, wherein the signal path comprises an output line, a transducer of the wind turbine generator, and an input line, wherein the output line is coupled to the transducer, wherein the transducer is coupled to the input line, wherein the electrical power applied to the signal path activates the transducer, and wherein the current measuring device is for applying a test current to the signal path while the transducer is deactivated;

a pulse generator for asserting a test pulse on the output line while electrical power is applied to the signal path;

a pulse detector for detecting the test pulse on one of the output line or the input line; and a failure detector for identifying an electrical failure within the wind turbine generator based on a combination of the current, whether the test pulse is detected on the output line, whether the test pulse is detected on the input line, and whether the test current reached the transducer.

10. A system, comprising:
a wind turbine;
   a tower;
   a nacelle disposed on the tower;
   a generator disposed in the nacelle;
   a rotor mechanically coupled to the generator at a first end;
   a plurality of blades coupled to a second end of the rotor;
a control system configured to control the wind turbine; and
a diagnostic system configured to detect failures in the control system, comprising:
   a current measurement device for measuring a current on a signal path within the control system while electrical power is applied to the signal path, wherein the signal path comprises an output line, a transducer of the generator, and an input line, wherein the output line is coupled to the transducer, wherein the transducer is coupled to the input line, wherein the electrical power applied to the signal path activates the transducer, and wherein the current measuring device is for applying a test current to the signal path while the transducer is deactivated;
   a pulse generator for asserting a test pulse on the output line while electrical power is applied to the signal path;
   a pulse detector for detecting the test pulse on one of the output line or the input line; and
   a failure detector for identifying an electrical failure within the generator based on a combination of the current, whether the test pulse is detected on the output line, whether the test pulse is detected on the input line, and whether the test current reached the transducer.

* * * * *